United States Patent [19]

Mizusawa

[11] Patent Number: 4,644,614
[45] Date of Patent: Feb. 24, 1987

[54] PLASTIC FASTENER FOR SPACING AND SUPPORTING TWO PLATES

[75] Inventor: Akira Mizusawa, Yokohama, Japan

[73] Assignee: Nifco, Inc., Yokohama, Japan

[21] Appl. No.: 874,623

[22] Filed: Jun. 16, 1986

[30] Foreign Application Priority Data

Jun. 26, 1985 [JP] Japan .............................. 60-97090[U]

[51] Int. Cl.⁴ .......................... F16B 13/04; H05K 7/12
[52] U.S. Cl. ........................................ 24/453; 24/297; 411/508; 174/138 D
[58] Field of Search .......................... 24/453, 297, 289; 411/508, 509, 510; 174/138 D; 16/221, 222

[56] References Cited

U.S. PATENT DOCUMENTS

| | | | |
|---|---|---|---|
| 3,996,500 | 12/1976 | Coules | 174/138 D |
| 4,080,522 | 3/1978 | Schimmels | 411/510 |
| 4,297,769 | 11/1981 | Coules | 174/138 D |
| 4,470,178 | 9/1984 | Matsui | 24/297 |
| 4,493,580 | 1/1985 | Ruehl | 174/138 D |
| 4,517,710 | 5/1985 | Beckmann | 24/453 |

Primary Examiner—Victor N. Sakran
Attorney, Agent, or Firm—Trexler, Bushnell & Wolters, Ltd.

[57] ABSTRACT

A fastener has a first plate-like base portion provided with an upright portion united by a hinge portion to an L-shaped portion terminating in a second plate-like base portion. The second plate-like base portion can be turned about the hinge portion to be locked in contact with a surface of the upright portion on the side opposite the hinge portion.

8 Claims, 14 Drawing Figures

PLASTIC FASTENER FOR SPACING AND SUPPORTING TWO PLATES

FIELD OF THE INVENTION AND RELATED ART STATEMENT

This invention relates to a fastener formed as a one piece molding of a plastic material for fastening a printed circuit board or the like to a chassis or the like.

Fasteners formed as one-piece moldings of a plastic material have heretofore been used to secure printed circuit boards assembled in electric apparatuses to a chassis thereof because they are insulating and capable of being readily fitted and removed.

When making inspection or repair of a printed circuit board after it has been secured to the chassis, one end of the board is detached from a fastener, and the board is turned about the fastener at the other end.

Figure 1:
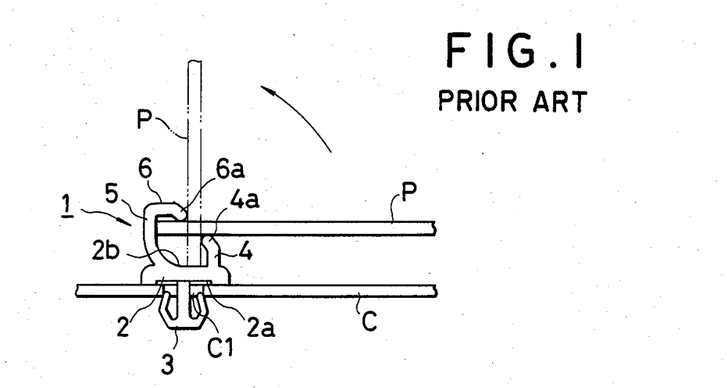
FIG. 1 is a front view showing a prior art fastener.
Figure 2:
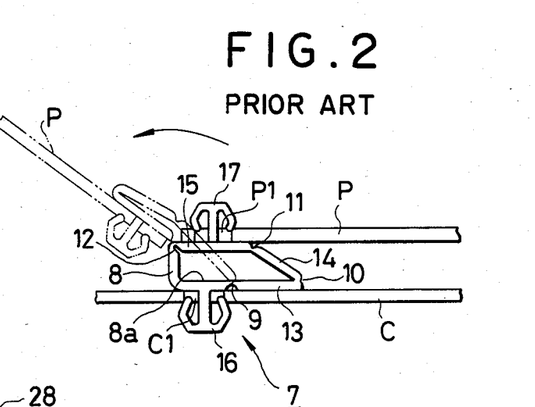
FIG. 2 is a front view showing another prior art fastener.

FIGS. 1 and 2 show examples of such a prior art fastener which can secure a printed circuit board and permits the board to be turned about it.

The fastener shown in FIG. 1 is a one-piece plastic molding. The illustrated fastener 1 has a plate-like base portion 2, an anchor-shaped hook portion 3 projecting from one surface 2a of the base portion 2 and two, i.e. long and short, clamp arm portions 4 and 5 projecting from the other surface 2b of the base portion 2. The short clamp arm portion 4 has an inclined free end portion 4a. The long clamp arm portion 5 has a bent portion 6 which has an inclined free end portion 6a. The free end portions 4a and 6a face each other and are spaced apart a slight distance.

This fastener 1 is used to secure a printed circuit board P to a chassis C such that the board P and chassis C are parallel. More specifically, to secure the printed circuit board P the hook portion 3 of the fastener is pressure fitted in a mounting hole C1 formed in the chassis C, thus securing the base portion 2 to the chassis C. Then, an edge of the printed circuit board P is inserted into the gap between the inclined free end portions 4a and 6a of the clamp arm portions 4 and 5 in a direction parallel to the chassis C to be clamped between the clamp arm portions 4 and 5. Thereafter, the other edge (not shown) of the printed circuit board P is secured by a holder or the like to the chassis C.

When making inspection or repair of the secured printed circuit board P, the other edge of the board P is detached from the holder, and the board P is turned in the state clamped between the inclined free end portions 4a and 6a of the clamp arm portions 4 and 5 about its clamped portion, as shown by a phantom line in FIG. 1.

The fastener shown in FIG. 2 is also a one-piece plastic molding. This fastener 7 has an L-shaped portion 8 and plate-like portions 13 to 15. The portions 8 and 13 to 15 are united into a loop-like form by reduced thickness hinge portions 9 to 12. The fastener 7 further has an anchor-shaped hook portion 16 projecting from the outer surface of a base portion 8a of the L-shaped portion 8. It further has an anchor-shaped hook portion 17 projecting from the outer surface of the plate-like portion 15.

This fastener 7 is also used to secure a printed circuit board P to a chassis C. More specifically, the hook portion 16 projecting from the L-shaped portion 8 is pressure fitted in a mounting hole C1 of the chassis C, thus securing the L-shaped portion 8 to the chassis C. Then, a mounting hole P1 formed in one edge portion of the printed circuit board P is pressure fitted on the hook portion 17 projecting from the plate-like portion 15. Thereafter, the other edge (not shown) of the board P is secured by a holder or the like to the chassis C such that the plate-like portion 15 extends parallel to the base portion 8a of the L-shaped portion 8 and plate-like portion 13.

When making inspection or repair of the secured printed circuit board P, the other edge of the board P is detached from the holder, and the fastener 7 is deformed by folding it at the hinge portions 9 to 12 into a form as shown by a phantom line in FIG. 2, thereby turning the printed circuit board P.

Neither of the prior art fasteners shown in FIGS. 1 and 2, however, has a lock mechanism for locking the secured printed circuit board after the board has been turned to a position at a predetermined angle relative to the chassis. Therefore, the printed circuit board in the turned state is instable and shaky when it is turned relative to the chassis for inspection or repair. In this state, it is liable to be turned over by a force applied to it, which is inconvenient for the operations of inspection or repair.

OBJECT AND SUMMARY OF THE INVENTION

An object of the invention is to provide a fastener, which can overcome the above drawbacks and permits the printed circuit board having been turned to be automatically locked in a stable state.

To attain the above object of the invention, there is provided a fastener, which comprises a first plate-like base portion for fastening a first member to be secured, an upright portion projecting from one surface of the first plate-like base portion, an L-shaped portion foldably united by a reduced thickness hinge portion to an intermediate portion of the upright portion and having a portion extending in the direction of the first plate-like base portion, and a second plate-like base portion extending from the other end of the L-shaped portion in the direction opposite to the direction, in which the first plate-like base portion substantially extends from the upright portion.

Normally, the first and second plate-like base portions extend substantially parallel to each other. When the second plate-like base portion and L-shaped portion are turned about the hinge portion in a direction away from the first plate-like base portion, the second plate-like base portion is brought into contact with the free end of the upright portion. With continued turning, the second plate-like base portion is locked by the back surface of the upright portion due to the elasticity of the material. The second plate-like base portion is released from the lock by pushing it toward the first plate-like base portion.

The above and other objects and features of the invention will become more apparent from the following detailed description with reference to the accompanying drawings.

DETAILED DESCRIPTION OF THE PREFERRED EMBODIMENTS

Figure 3:
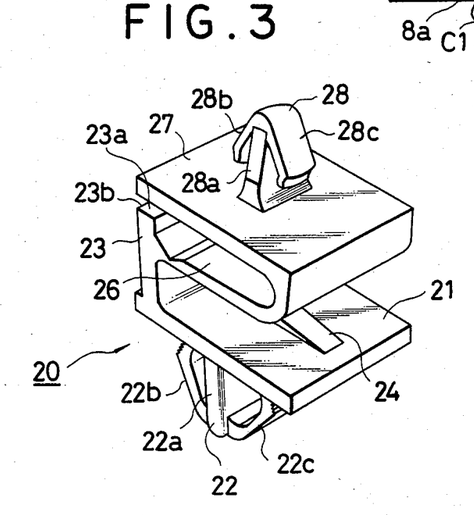
FIG. 3 is a perspective view showing an embodiment of the fastener according to the invention.
Figure 4:
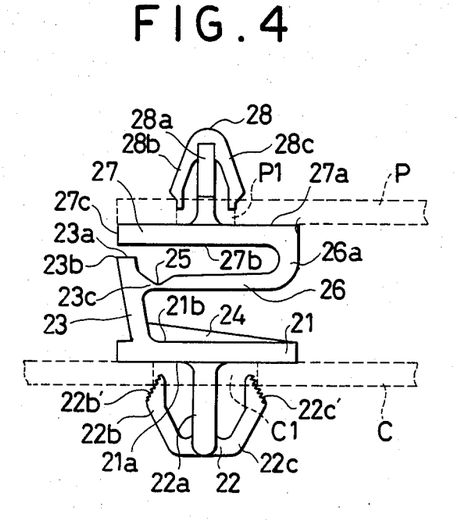
FIG. 4 is a front view showing the same fastener.

FIGS. 3 and 4 show an embodiment of the fastener according to the invention.

Referring to the Figures, reference numeral 20 designates the fastener according to the invention. The fastener 20 has a first plate-like base portion 21. A first hook portion 22 projects from a substantially central portion of one surface 21a of the first base portion 21.

The first hook portion 22 has a well-known anchor-like sectional profile consisting of a perpendicular plate-like portion 22a and pawl portions 22b and 22c extending from the opposite sides of the free end of the perpendicular portion 22a. The first hook portion 22 is adapted to be pressure fitted in a mounting hole C1 of a chassis C, for instance, which is a first member to be secured. When the hook portion 22 is inserted through the mounting hole C1, the pawl portions 22b and 22c are urged and inwardly flexed by the edge of the mounting hole C1. When a substantial portion of the pawl portions 22b and 22c clears the mounting hole C1, the pawl portions 22b and 22c restore to the initial state, and their end portions 22b' and 22c' engage the mounting hole C1. Thus, the first base portion 21 is secured to the chassis C.

The fastener 20 also has an upright portion 23 extending from an end portion of the opposite surface 21b of the first base portion 21. The upright portion 23 extends from a portion close to one end of the first base portion 21 over the entire width thereof. It is plate-like in shape and slightly inclined with respect to a normal line to the first base portion 21, and its free end surface is parallel thereto. The corner 23b on the left side (in FIG. 4) of the end 23a of the upright portion 23 thus has an acute angle.

Lest the upright portion 23 should flex, its stem portion is reinforced by a reinforcing rib 24 integral with the first base portion 21, the height of the rib 24 increasing as one goes from the right end (in FIG. 4) of the first base portion 21.

The upright portion 23 has a ridge-like portion 23c provided on the right side of its intermediate portion (slightly below its free end). The ridge-like portion 23c is united via a reduced thickness hinge portion 25 to an L-shaped portion 26a, which has a portion extending substantially parallel to the first base portion 21.

The substantially parallel portion of the L-shaped portion 26 increases in thickness as one goes away from the hinge portion 25, and it terminates in a perpendicular portion 26a, which in turn terminates in a second plate-like base portion 27 extending above the upright portion 23 (in FIG. 4) and parallel to the first plate-like base portion 21.

The lower surface 27b (in FIG. 4) of a free end portion 27c of the second base portion 27 and the free end surface 23a of the upright portion 23 face each other and are spaced apart by a small distance so that they can be brought into contact with each other when the L-shaped portion 26 is turned about the hinge portion 25 in the direction away from the first base portion 21.

The fastener 20 further has a second hook portion 28 projecting from a central portion of one surface 27a of the second plate-like base portion 27. The second hook portion 28, like the first hook portion 22, has an anchor-shaped sectional profile, consisting of a perpendicular portion 28a and pawl portions 28b and 28c extending from the opposite sides of the free end of the perpendicular portion 28a. The hook portion 28 may be pressure fitted in a mounting hole P1 of a printed circuit board P, whereby the board P is secured to the second base portion 27.

The fastener 20 having the above structure is a one-piece plastic molding having adequate rigidity and elasticity, and the hinge portion 25 is elastically foldable. Further, when the L-shaped portion 26 is deformed away from the second base portion 27, a strong restoring force is produced. Further, when the pawl portions of the hook portions 22 and 28 are deformed, a strong restoring force is produced. The thicknesses of the L-shaped portion and pawl portions are set accordingly.

The operation of the embodiment of the fastener 20 having the above construction will now be described.

Figure 5:
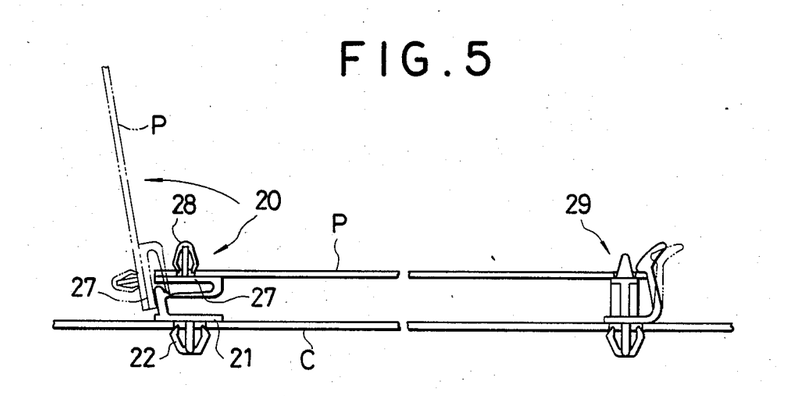
FIG. 5 is a front view showing the fastener of FIG. 3 used to secure a printed circuit board to a chassis.
Figure 6:
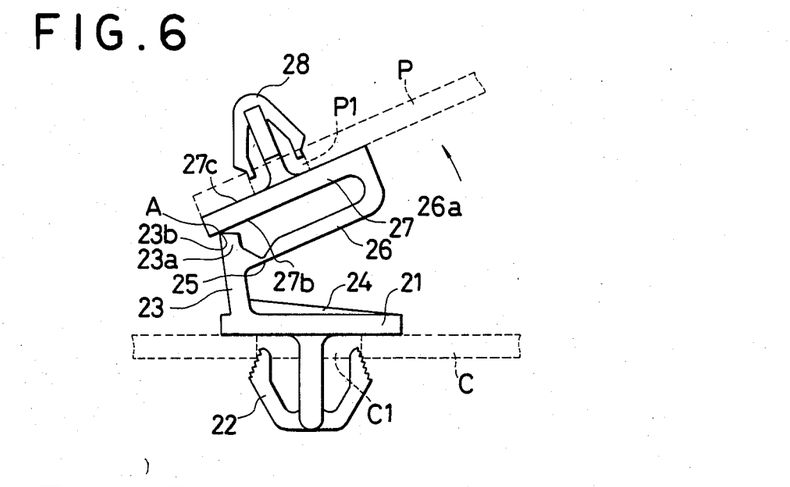
FIGS. 6 to 9 are front views for explaining an operation of folding the fastener of FIG. 3 about a hinge portion.

The fastener of the embodiment is used to fasten, for instance, to the chassis C (the first member to be secured) the printed circuit board P (the second member to be secured) such that the chassis C and printed circuit board P are parallel. In this case, as shown in FIGS. 4 and 5, the first hook portion 22 projecting from the first base portion 21 is pressure fitted in the mounting hole C1 of the chassis C, and the second hook portion 28 projecting from the second base portion 27 is pressure fitted in the mounting hole P1 formed in an end portion of the printed circuit board P. Then, the other end of the printed circuit board P is secured by a suitable holder 29 (which may of course be a fastener according to the invention) to the chassis C.

For inspection or repair of the installed printed circuit board, the other end of the board P is detached from the holder 29, and the board P is turned about the fastener (in the counterclockwise direction in FIG. 5).

Figure 7:
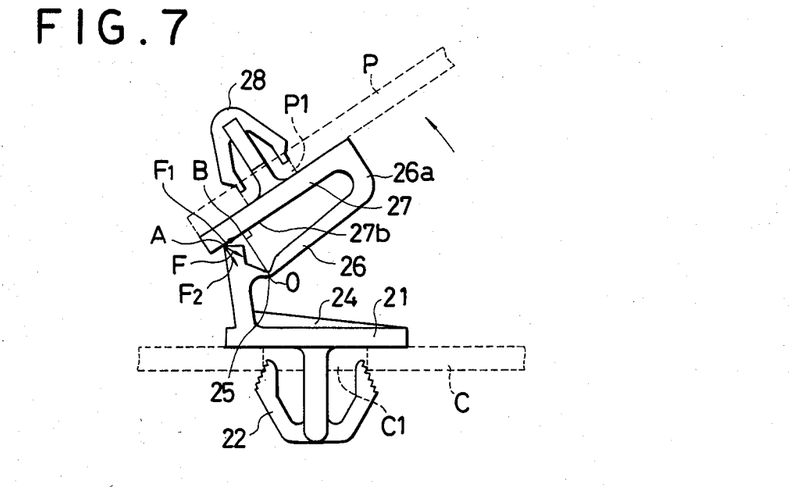

As a result, the L-shaped portion 26 and second base portion 27 of the fastener 20 are turned about the hinge portion 25 in the counterclockwise direction, so that the surface 27b of an end portion 27c of the second base portion 27 on the side of the L-shaped portion 26 is eventually brought into contact with the corner 23b of the free end 23a of the upright portion 23 on the side opposite the hinge portion 25. When the printed circuit board P is further turned, the L-shaped portion 26 is gradually deformed against its elasticity away from the second base portion 27, as shown in FIG. 7, because the second base portion 27 is in contact with the corner 23b.

However, while the point A of contact between the surface 27b and corner 23b is on the same side as the free end of the second base portion 27 of the intersection B of a normal line to the surface 27b, passing through the hinge 25 (shown at 0), a component F1 of the restoring force F applied to the second base portion 27 due to the elasticity of the L-shaped portion 26 (in the direction toward the point 0 of the hinge portion 25) is opposite in direction to the torque applied to the printed circuit board P in the direction of the surface 27b.

Figure 8:
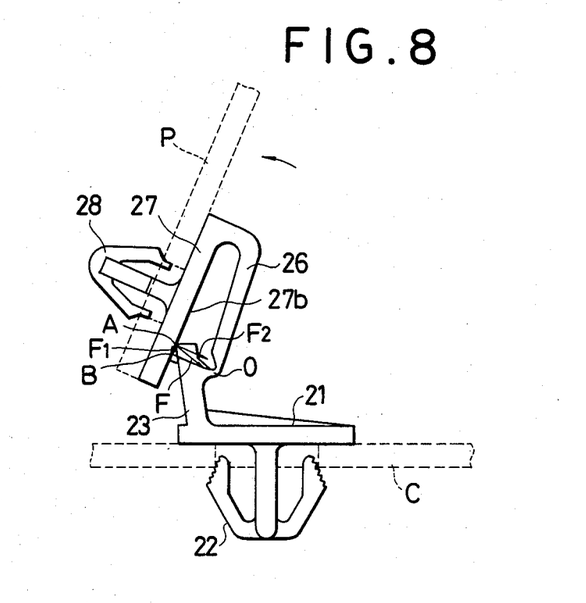
Figure 9:
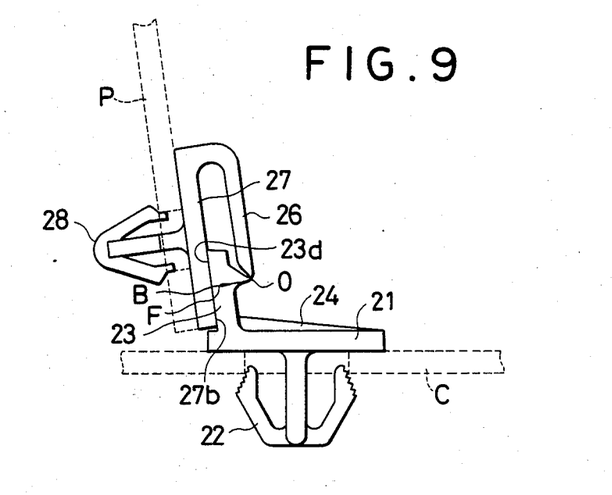

The deformation of the L-shaped portion 26 is increased as the point B approaches the point "A" with further turning of the printed circuit board P. When the point B coincides with the point A, the L-shaped portion 26 is deformed to a maximum extent away from the second base portion 27. At this moment, the restoring force F is maximum. When the point A exceeds the intersection point B of the normal line to the surface 27b, the component F1 in the direction of the surface 27b reverses its direction so that it is directed toward the free end of the second base portion 27 as shown in FIG. 8. Due to this component F1 of the restoring force F due to the elasticity of the L-shaped portion 26, the printed circuit board P is automatically further turned even when the applied torque is removed from it. Consequently, the surface 27b of the second base portion 27 is brought into close contact with the surface 23d of the upright portion 23 on the side opposite the hinge portion 25, as shown in FIG. 9. At this time, the restoring force F acts in the direction of urging the second base portion 27 against the upright portion 23, as shown in FIG. 9. The printed circuit board P thus is locked in the close contact state shown in FIG. 9, i.e. in a state parallel to the upright portion 23.

To restore the printed circuit board P, it is turned in the clockwise direction. When the point B exceeds the point A in this case, the direction of the component F1 of force F is reversed so that the component F1 is directed in a direction of causing further clockwise rotation of the printed circuit board P. Thus, the printed circuit board P is released from the locked state.

As has been shown in the foregoing, the embodiment of the fastener 20 permits fastening of the printed circuit board P to the chassis C and also permits the printed circuit board P to be turned about it to be automatically locked at a position at a predetermined angle to the chassis C (i.e., an angle between the first base portion 21 and upright portion 23). In addition, since the component F1 of force F is reversed in direction at the instant of reaching a certain angle at the time of the locking, a nodal feel can be obtained in locking. The locked printed circuit board P is held parallel to the upright portion 23 and is not shaky or will not be turned over by a force applied to it, which is convenient for the operations of inspection and repair.

Further, the center of rotation of the printed circuit board P is spaced apart from the printed circuit board P toward the chassis C compared to the cases of the prior art fasteners shown in FIGS. 1 and 2. Thus, less space is traversed when the printed circuit board P is turned, which is advantageous for an electric apparatus in which only a little space is available.

Figure 10:
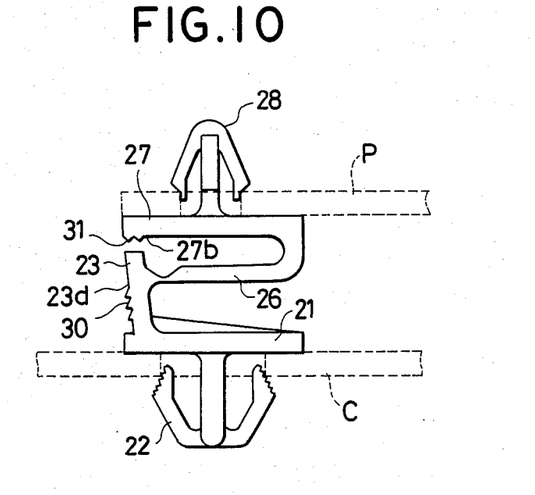
FIGS. 10 to 14 are front views showing different embodiments of the fastener according to the invention.

FIG. 10 shows a different embodiment of the invention.

In this embodiment, the surface 23d of the upright portion 23 and the surface 27b of the second base portion 27 are provided with respective ratchet tooth sections 30 and 31 which are adapted to be in mesh with each other.

In this embodiment of the fastener, the printed circuit board can be further firmly held in the locked state by the mesh between the ratchet tooth sections 30 and 31. In addition, it is possible to permit selection of a plurality of different lock angles of the printed circuit board P with corresponding relative mesh positions of the ratchet tooth sections 30 and 31.

Figure 11:
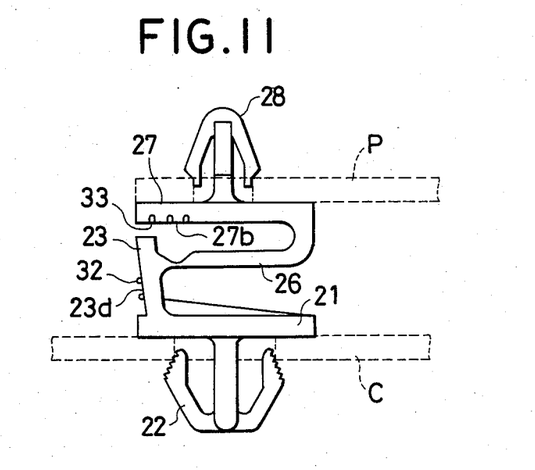

FIG. 11 shows a further embodiment. In this instance, the surface 23d of the upright portion 23 and the surface 27b of the second base portion 27 are provided with engagement projections 32 and engagement recesses 33, respectively, which are engaged with respect to one another when the printed circuit board is locked.

It is possible to permit selection of a plurality of different lock angles of the printed circuit board again by providing a plurality of engagement recesses 33 for being selected to receive engagement projections 32.

Figure 12:
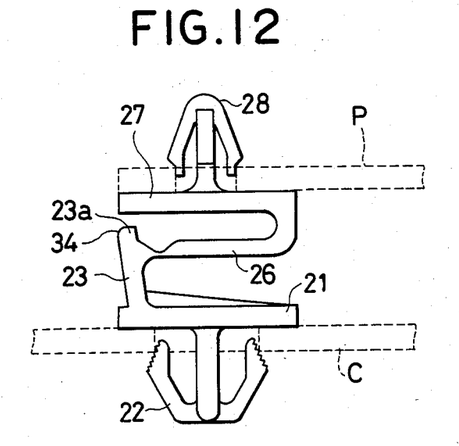

FIG. 12 shows a further embodiment. In this instance, a corner of the free end surface 23a of the upright portion 23 has an arcuate sectional profile 34.

This arcuate corner permits smooth turning of the printed circuit board P.

Further, the surface 23c of the upright portion 23 and surface 27c of the second base portion 27 may be made rough to provide for an increased frictional force.

While some preferred embodiments have been shown, they are by no means limitative and can be variously modified. For example, the first and second hook portions 22 and 28 may have different shapes, e.g., a spearhead.

Figure 13:
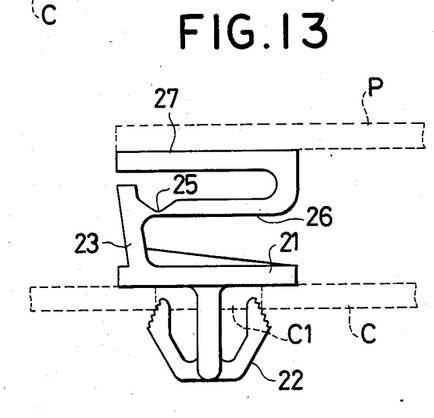

Further, it is possible to omit one or both of the first and second hook portions 22 and 28. FIG. 13 shows a modification, in which the printed circuit board P (or chassis C) is bonded to the second base portion 27 (or first base portion 21). Further, the printed circuit board or chassis may otherwise be secured by a securement member such as a screw (not shown).

Figure 14:
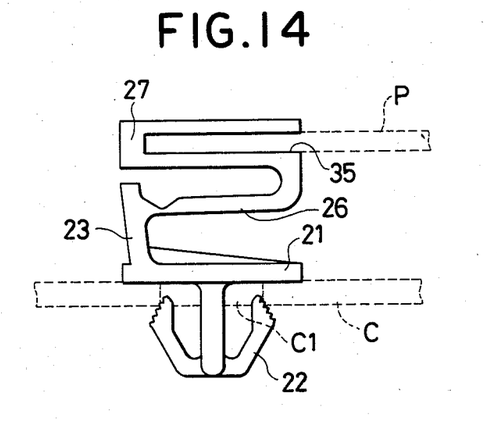

FIG. 14 shows a further modification. In this instance, the second base portion 27 (or first base portion 21) is increased in thickness and is formed with a mounting groove 35 in which an end portion of the printed circuit board P is inserted to be secured.

Furthermore, a curved portion may be provided in lieu of the L-shaped portion 26. Moreover, while the foregoing description has concerned with the fastening of the printed circuit board P to the chassis C, this is by no means limitative, and the invention may be applied to the fastening of other members as well.

As has been described in the foregoing, the fastener according to the invention permits fastening of a printed circuit board or the like and also permits automatic locking of the board or the like at a position at an angle to a chassis or the like. Further, it is possible to minimize the space which is traversed by the printed circuit board or the like when the board is turned relative to the chassis or the like. Since the printed circuit board can be firmly and stably held locked at an angle relative to the chassis for inspection or repair, the operation of the inspection or repair can be conveniently carried out. Further, it is possible to eliminate or reduced the possibility that the printed circuit board strikes a different object when it is turned.

What is claimed is:

1. A fastener consisting of a one-piece molding of a plastic material, comprising:
    a first plate-like base portion for fastening a first member to be secured;
    an upright portion projecting from one surface of said first plate-like base portion;
    an L-shaped portion foldably united by a reduced thickness hinge portion to an intermediate portion of said upright portion and having a portion extending in the direction of said first plate-like base portion; and
    a second plate-like base portion extending from the other end of said L-shaped portion in the direction opposite to the direction in which said first plate-like base portion substantially extends from said upright portion, and substantially parallel to said first plate-like base portion, for fastening a second member to be secured;
    said second plate-like base portion being brought into contact with the free end of said upright portion when said second plate-like base portion and L-shaped portion are turned about said hinge portion in a direction away from said first plate-like base portion, said second plate-like base portion being brought into and held in contact with a surface of said upright portion on the side opposite said hinge portion due to elastic restoring force of said L-shaped portion when the point of contact between said second plate-like base portion and free end of said upright portion exceeds a point of intersection between said second plate-like base portion and a line normal to said second plate-like base portion and passing through said hinge portion.

2. The fastener according to claim 1, wherein the portions of said second plate-like base portion and upright portion which are in contact with each other when said second plate-like base portion is brought to a locked state perpendicular to said first plate-like base portion are provided with respective ratchet tooth sections capable of meshing with each other.

3. The fastener according to claim 1, wherein the portions of said second plate-like base portion and upright portion which are in contact with each other when said second plate-like base portion is brought to a locked state perpendicular to said first plate-like base portion are provided with engagement projections and engagement recesses, respectively.

4. The fastener according to claim 1, wherein the free end of said upright portion has a sharp corner to be engaged by said second plate-like base portion.

5. The fastener according to claim 1, wherein the free end of said upright portion has an arcuate corner to be engaged by said second plate-like base portion.

6. The fastener according to claim 1, wherein the portions of said second plate-like base portion and upright portion which are in contact with each other when said second plate-like base portion is brought to a locked state perpendicular to said first plate-like base portion have rough surfaces providing a large friction force therebetween.

7. The fastener according to claim 1, which further has hook portions provided on the outer surfaces of said first and second plate-like base portions for hooking said first and second members to be secured.

8. The fastener according to claim 1, which further has a rib for reinforcing said first plate-like base portion and upright portion.

* * * * *